United States Patent [19]

Umeda

[11] Patent Number: 5,039,592

[45] Date of Patent: Aug. 13, 1991

[54] PHOTOSENSITIVE RESIN BASE MATERIAL FOR MAKING RELIEF PRINTING PLATES HAVING A SLIP LAYER CONTAINING A BLUE ANTHROQUINONE

[75] Inventor: Yasushi Umeda, Kustasu, Japan

[73] Assignee: Nippon Paint Co., Ltd., Osakashi, Japan

[21] Appl. No.: 525,116

[22] Filed: May 17, 1990

Related U.S. Application Data

[63] Continuation-in-part of Ser. No. 310,474, Feb. 13, 1989, abandoned, which is a continuation of Ser. No. 198,615, May 20, 1988, abandoned, which is a continuation of Ser. No. 938,853, Dec. 8, 1986, abandoned.

[30] Foreign Application Priority Data

Dec. 9, 1985 [JP] Japan ................................ 60-276531
Oct. 16, 1986 [JP] Japan ................................ 61-246835

[51] Int. Cl.$^5$ .............................................. G03C 1/492
[52] U.S. Cl. ..................................... 430/271; 430/281; 430/306; 430/273
[58] Field of Search ................. 430/271, 281, 306, 273

[56] References Cited

U.S. PATENT DOCUMENTS

| | | | |
|---|---|---|---|
| 3,965,278 | 6/1976 | Duinker et al. ...................... | 427/54 |
| 4,469,775 | 9/1984 | Lynch et al. ........................ | 430/273 |
| 4,528,262 | 7/1985 | Nakano et al. ..................... | 430/325 |
| 4,576,897 | 3/1986 | Fujikawa et al. .................. | 430/273 |
| 4,623,611 | 11/1986 | West .................................... | 430/329 |
| 4,663,275 | 5/1987 | West et al. .......................... | 430/271 |
| 4,677,049 | 6/1987 | Griffing et al. .................... | 430/339 |

FOREIGN PATENT DOCUMENTS 2032125A 4/1980 United Kingdom .

*Primary Examiner*—Jack P. Brammer
*Attorney, Agent, or Firm*—Woodcock Washburn Kurtz Mackiewicz & Norris

[57] ABSTRACT

A photosensitive resin base printing material in the form of laminate comprising, in successive order, a support, a photosensitive resin layer, a slip layer of a high molecular substance which is soluble or swellable in a developer, an optional releasing layer and a sheet or film form of protective layer, which is characterized in that a dyestuff is included in an amount of 0.01 to 20% by weight of the high molecular weight substances in said slip layer.

The present printing material is specifically excellent in resolution and far improved as compared with heretofore proposed printing materials in respect to both handling and visual inspection properties.

11 Claims, No Drawings ial element and more specifically, it
PHOTOSENSITIVE RESIN BASE MATERIAL FOR MAKING RELIEF PRINTING PLATES HAVING A SLIP LAYER CONTAINING A BLUE ANTHROQUINONE This application is a continuation-in-part of pending application Ser. No. 310,474, filed Feb. 13, 1989, now abandoned, which is a continuation of Ser. No. 198,615, filed May 20, 1988, now abandoned, which is a continuation of Ser. No. 938,853, filed Dec. 8, 1986, now abandoned.

FIELD OF THE INVENTION

The present invention relates to a photosensitive resin base printing material element and more specifically, it concerns a photosensitive resin base printing material characterized by providing a slip layer of a high molecular weight substance containing a dyestuff on a photosensitive resin layer, which is excellent in resolution and can be easily handled and visually inspected in the preparation of a printing plate.

BACKGROUND OF THE INVENTION

In various relief printing areas including newspaper printing, flexographic printing material has been widely used. Such material is usually constructed as a laminate comprising, in successive order, a support, a photosensitive layer consisting essentially of a developer soluble, high molecular weight binder, a polymerizable unsaturated monomer or monomers and a photoinitiator, slip layer of a high molecular weight substance for the purpose of improving a close contact of the photosensitive resin layer to an original, a releasing layer and a protective film or sheet.

On the use of such material, the protective film or sheet and the releasing layer are peeled out to expose the slip layer of the laminate. An original is then placed on said slip layer and exposed to an actinic radiation for a desired time to effect photo-curing (or setting) of the exposed resin layer.

The exposed material is then treated with a developer to remove the unexposed, uncured photosensitive resin and the slip layer to obtain a printing plate having a relief exactly copying the image in the original.

Therefore, from a standview of light penetration, it is preferred that the photosensitive layer is as clear as possible, and, in fact, many of the commercialized printing materials do bear a transparent photosensitive resin layer. Light goes through the resin layer. However, it is well know that when a light beam passes through a medium with a certain thickness, there often occurs irregular reflection or refraction of the light depending on the nature of said medium. In the preparation of a relief printing plate using a photosensitive resin base printing material, such irregular reflection or refraction of an incident light is believed to be important for the formation of shoulder of the relief image.

However, excessive amounts of irregular reflection or refraction are undesirable because it would cause photocuring, in certain degree, at the unexposed area of the photosensitive layer (the so-called fogging phenomenon), and hence, a deficient dissolving of the photosensitive layer at the unexposed area in a development stage.

More concretely speaking, at the time when a halftone negative with various sizes of dots is closely contacted as an original with a transparent photosensitive resin layer and exposed to a light, there are indeed no particular problems at the portion of said photosensitive resin layer where it is contacted with negative dots having comparatively smaller dot-area (the so-called high-light area of letterpress), but at the portion where the photosensitive resin layer is contacted with negative dots having comparatively larger dot-area (the so-called shadow area of letterpress), there arises the so-called fogging phenomenon, thereby resulting in the loss of shoulder under the influence of irregular reflection of incident light and reflected light from a support. As a consequence, a shallow depth image is transformed at the shadow area of the printing plate and a solid printing is results.

Attempts have therefore been made to provide an antihalation layer containing a pigment or dyestuff which will absorb visible or ultraviolet rays used in an exposure stage, between a photosensitive resin layer and a support, thereby absorbing the reflected light from the support and reducing the undesired influence of the reflected light toward shadow area. However, in that case, the desired amounts of reflected light for high-light area are likewise absorbed and there often arises the case wherein high-light area, fine letter or fine dot area are exposed deficiently. To compensate for this, a longer time exposure is required.

Moreover, it is essential that a non-diffusing coloring matter should be selected. This is because, if the coloring matter is of diffusible nature there is a tendency that the coloring matter used would migrate into a lower portion of the photosensitive layer through diffusion, whereby the reflected light desired for photo-curing of resin at that portion is objectionably absorbed. Thus, there occurs a side-edging of the image at high-light area, fine letter or fine dot area and, in an extremely case, undesired falling off the relief image.

In other attempts, such coloring matters are directly added to and uniformly kneaded with a photosensitive resin composition to be used for the preparation of photosensitive layer. However, in this case, an incident light is inevitably absorbed by the photosensitive layer itself in regular succession as it goes through said layer. Therefore, there is a severe side-edging of the relief image at the high-light area and the like and falling off of the desired image. Even if a long time of exposure is adopted, there are various troubles such as fogging and the like at the shadow area, in return.

Thus, a photosensitive resin base printing material capable of resulting high quality images both in shadow area, where it is easily affected by irregular reflection of incident light and reflected light from a support at a comparatively upper portion of a photosensitive layer, and in high-light area, where it is easily affected by transmitted light and reflected light from a support at a comparatively lower portion of the photosensitive layer, has never been found.

It is, therefore, an object of the present invention to provide a printing material capable of resulting high quality images both in high-light and shadow areas, through conventional processes of photo-exposure and development. An additional object of the invention is to provide a printing material having an improved resolution and being useful in a relief printing area.

SUMMARY OF THE INVENTION

The above-mentioned and other objects of the invention can be attained by a photosensitive resin base printing material in the form of laminate comprising, in successive order, a support, a photosensitive layer, a slip layer of a high molecular weight substance which is soluble or swellable in a developer, an optional releasing layer and a sheet or film form of protective layer, characterized by containing a dyestuff in the slip layer in an amount corresponding to 0.01 to 20% by weight of the total weight of said high molecular substance.

PREFERRED EMBODIMENTS OF THE INVENTION

The present printing material consists of a laminate comprising, in successive order, a support, a photosensitive layer, a slip layer, an optional releasing layer and a protective layer.

Though the laminate construction and compositions of these constituting layers are conventional, the invention is characterized in that a dyestuff and especially a photo-bleaching dyestuff hereinafter defined is included in a specified amount in said slip layer.

In this invention, as a support, the following may be satisfactorily and advantageously used in a sheet or film form:

A metal material such as aluminum, zinc, iron and the like; a plastic material such as polyethylene terephthalate, polyethylene, polymethyl methacrylate, Nylon, cellulose acetate, polypropylene, polycarbonate, polyvinyl chloride and the like; a natural or synthetic rubber, a rubber foam (e.g. urethane foam, butadiene foam); a glass material; and any combination or laminate thereof. If desired, the support surface may be pre-treated by etching, anodizing, corona discharge and the like, or applied with an adhesive layer and/or an antihalation layer beforehand.

On this support is usually placed a photosensitive layer consisting essentially of a high molecular weight binder, a polymerizable unsaturated monomer or monomers, and a photo-initiator.

As the binder, there may be used any high molecular weight material which is compatible with the polymerizable unsaturated monomer and the photo-initiator and combine a composition for the photosensitive layer onto the support.

Examples of such binder are crystalline 1,2-polybutadiene, styrene-butadiene-styrene copolymer, styreneisoprenestyrene copolymer, nitrile butadiene resin, polyamide resin which is soluble in a lower alcohol or water, polyurethane resin, polyester resin, polyvinyl alcohol and the like. Among them, particularly preferred members are crystalline 1,2-polybutadiene, styrene-butadiene-styrene copolymer, and styrene-isoprene-styrene copolymer, because they are easily formed into sheets at a relatively lower temperature without the risk of causing thermal polymerization of the polymerizable unsaturated monomers used.

The polymerizable unsaturated monomers may be any members customarily used in this type of photosensitive resin layer as, for example, 2-ethyl hexyl acrylate, 2-ethyl hexyl methacrylate, octyl acrylate, octyl methacrylate, lauryl acrylate, lauryl methacrylate, stearyl acrylate, stearyl methacrylate, trimethylolpropane triacrylate, trimethylolpropane trimethacrylate, trimethylolethane triacrylate, trimethylolethane trimethacrylate, ethylene glycol acrylate, ethylene glycol methacrylate, trimethylene glycol diacrylate, triethylene glycol dimethacryatle, β-hydroxyethyl methacrylate, β-hydroxyethyl methacrylate, β-hydroxypropyl acrylate, β-hydroxypropyl methacrylate, acrylamide, methacrylamide, N,N'-methylenebisacrylamide and the like.

It is, of course, possible to use other unsaturated compounds than the above mentioned monomers, provided they are capable of being polymerized with the help of photo-activated photo-initiator and are compatible with the binder material used.

The third component of photo-initiator may be any compound capable of being activated by a chemical radiation and initiating the polymerization of said monomer(s). Examples of such compounds are benzoin, benzoin alkyl ether, benzyl, acetophenone, 2,2-dimethoxy 2-phenyl acetophenone, benzyl anthraquinone, 2-methyl anthraquinone, 2-t-butyl anthraquinone, p-dinitrobenzene, 2-chloro-4-nitroaniline, 9-anthranyl aldehyde, benzophenone, 1,2-naphthoquinone, 4-naphthoquinone and the like. Among them, particular preference is given to benzoin, benzoin alkyl ether, and 2,2-dimethoxy-2-phenyl acetophenone, because they are stable even at the molding temperature of the photosensitive resin layer composition.

The photosensitive resin layer of this invention consists essentially of the above mentioned polymeric binder, polymerizable unsaturated monomer(s) and photo-initiator. However, other additives such as thermal polymerization inhibitor (e.g. hydroquinone, p-methoxy phenol, t-butyl catechol, 2,6-di-t-butyl cresol), plasticizer and the like may be added if desired.

The photosensitive resin layer is advantageously formed directly on the support by, for example, an extrusion molding of a photosensitive resin composition containing the above said components. It is, of course, possible to make the photosensitive resin sheet or film beforehand, contact the same, with or without an intervening adhesive layer, with a support and effect a contact-bonding of thus formed laminate.

Those skilled in the art will appreciate that the photosensitive resin layer should have a thickness greater than about 500 μm, preferably between 500 μm and 7.5 mm, in order to be useful in the fabrication of relief printing plates.

The bonding of said photosensitive layer with the support may be effected by any conventional means such as heat pressing, casting, solution casting, lamination or extrusion molding and the like.

Usually, a slip layer of a high molecular weight substance is positioned between the photosensitive layer and the releasing layer hereinunder stated or, in the absence of such releasing layer, a protective layer hereinunder stated, to furnish a smooth and non-tacky surface and secure a close contact of the photosensitive layer with an original at an exposure stage. This layer is required to be soluble or swellable in water or alcohol or other solvents used for the development of the photosensitive resin layer.

In the heretofore proposed printing materials, this layer is always constructed as a transparent or semi-transparent, light permeable layer. However, in this invention, a coloring dyestuff is included in a specified amount in this slip layer, which is the most characteristic feature of this invention.

The dyestuff used in the present invention may be any member customarily used photographic area or the like as antihalation dyestuff. These may be classified in the following groups:

Azo series dyestuffs, such as monoazo dyestuffs, polyazo dyestuffs, metal complex azo dyestuffs, pyrazolone azo dyestuffs, stilbene azo dyestuffs and thiazol azo dyestuffs; anthraquinone series dyestuffs, such as anthraquinone derivatives, anthrone derivatives; Indigoid dyestuffs, such as indigo derivatives and thioindigo derivatives; phthalocyanine series dyestuffs; carbonium series dyestuffs, such as diphenylmethane dyestuffs, triphenylmethane dyestuffs, xanthene dyestuffs and acridine dyestuffs; quinone imine dyestuffs, such as azine dyestuffs, oxazine dyestuffs and thiazine dyestuffs; methine dyestuffs, such as polymethine dyestuffs and azomethine dyestuffs; quinoline dyestuffs; nitro dyestuffs, nitroso dyestuffs; benzoquinone and naphthoquinone dyestuffs; naphthalimide dyestuffs and the like. The presence of such dyestuff in a relatively thin slip layer of 0.5 to 20 μm thickness, preferably 0.5 to 10 μm thickness, is effective for controlling the amounts of incident light and reflected light from a support at a relatively upper portion of the photosensitive layer and giving a better quality image at a shadow area of the printing plate. Even if a part of said dyestuff migrates into an upper part of the photosensitive layer through diffusion, most parts of said photosensitive layer, and especially the lower part thereof, are maintained in a substantially clear state, and therefore, there is no undesirable decrease in light volume of penetrating light; good quality image can be secured even at a high-light area of the printing plate.

In a more preferable embodiment of this invention, said dyestuff is selected from the members having photo-bleaching properties. Examples of such members are azo dyestuffs, azomethine dyestuffs, triphenylmethane dyestuffs, xanthene dyestuffs, oxazine dyestuffs, naphthol dyestuffs, anthraquinone dyestuffs, cyanine dyestuffs and the like. More specifically, the following organic dyestuffs may be employed:

Magenta color: C.I. acid red 249 (color index 18134), C.I. direct red 20 (color index 15075), C.I. acid red 32 (color index 17065), C.I. acid red 92 (color index 45410), C.I. basic violet 7 (color index 48020) C.I. basic red 13 (color index 48015), C.I. Solvent red 1 (color index 12150), C.I. Solvent red 23 (color index 26100), C.I. Solvent red 49 (color index 45170 B), C.I. Solvent red 109 (color index 13900) and the like;

Cyane color: C.I. acid blue 83 (color index 42660), C.I. acid blue 9 (color index 42090), C.I. basic blue 1 (color index 42025), C.I. basic blue 5 (color index 42140), C.I. direct blue 106 (color index 51300), C.I. disperse blue 26 (color index 63305), C.I. Solvent blue 2 (color index 42563 B), C.I. Solvent blue 36, C.I. Solvent blue 93, C.I. Solvent blue 73 and the like;

Yellow color: C.I. acid yellow 25 (color index 18835), C.I. acid yellow 29 (color index 18900), C.I. acid yellow 42 (color index 22910), C.I. disperse yellow 3 (color index 11855), C.I. reactive yellow 2 (color index 18972);

Black color: C.I. acid black 52 (color index 15711), C.I. acid black 24 (color index 26370), C.I. direct black 17 (color index 27700) and the like.

These dyestuffs are soluble in water, alcohol or organic solvents and employed singularly or in combination.

Employment of such photo-bleaching dyestuff may afford additional benefit, since the dyestuffs contained in an exposed area are rapidly photo-bleached, a far more reliable light penetration can be realized at the high-light area and a far better control of image quality in both high-light and shadow areas can be attained.

When a dyestuff capable of being photo-bleached by visual or ultraviolet rays and regaining its color after oxidation in air, as anthraquinone dyestuffs and the like used in said slip layer, the formed relief image can be more easily visualized by naked eyes. Therefore, in the most preferred embodiment of the invention, a dyestuff having both photo-bleaching and color re-developing properties, such as anthraquinone dyestuffs, is selectively used. The high molecular weight substance to be used in said slip layer must be soluble or swellable in a developer. Thus must also be compatible with said dyestuff and must be a binder and combine the layer onto a photosensitive layer. From these standviews, particularly preferred high molecular weight substances are a high molecular weight polymer containing a N—C bond wherein the carbon atoms bear one or more hydrogen atoms, a high molecular weight polymer containing a secondary OH group and a high polymer containing a benzene ring bearing at least one of methyl, methylene or methine group. Specific examples are as follows:

(1) Polyamide resins such as nylons (e.g. nylon 6, nylon 8, nylon 11, nylon 12, nylon 66, nylon 610, nylon 612), nylon copolymers (e.g. nylon 6/66, nylon 6/12, nylon 6/66/610, nylon 6/66/12) and N-substituted nylons. Examples of the substituent in N-substituted nylons are lower alkyl (e.g. methyl, ethyl, n-propyl, isopropyl, n-butyl, sec-butyl), hydroxy (lower) alkyl (e.g. hydroxymethyl, β-hydroxyethyl, 2-hydroxypropyl), cyano (lower) alkyl (e.g. 2-cyanoethyl), halo (lower) alkyl (e.g. 2-chloroethyl), lower alkoxy (lower) alkyl (e.g. methoxymethyl, ethoxymethyl, n-butoxymethyl, 2-methoxyethyl, 2-n-butoxymethyl, 4-methoxbutyl), phenoxy (lower) alkyl (e.g. phenoxymethyl) and the like.

(2) Urea resins such as butylated urea resin
(3) Urethane resins
(4) Melamine resins
(5) N-substituted high polymers having acrylamide and/or methacrylamide units. Examples of the substituent are those as described in (1).
(6) Vinyl acetate polymers (homopolymers and copolymers) and their partially saponified products. Examples are polyvinyl acetate, 50% saponified polyvinyl acetate, vinyl acetate-vinyl chloride-maleic acid copolymer vinyl acetateethylene copolymer, vinyl acetate-acrylic acid copolymer and the like. In case of the copolymers wherein the vinyl acetate units are partially saponified, the content of the vinyl alcohol units is preferred to be 5 to 95 mole % based on the total amount of the monomeric units.
(7) Polymers of vinyl monomers having a secondary hydroxy group. Examples of such vinyl monomers are 2-hydroxypropyl methacrylate, 2-hydroxybutyl acrylate, 2-hydroxypropyl p-vinylbenzoate, p-2-hydroxypropoxystyrene and the like.
(8) Epoxy resins.
(9) Cellulose resins such as methyl cellulose, ethyl cellulose, cellulose acetate butyrate, nitrocellulose, cellulose phthalate, hydroxymethyl cellulose, hydroxypropyl cellulose and hydroxypropylmethyl cellulose phthalate.
(10) Butyral resins such as polyvinylbutyral and vinylacetal butyral copolymer.
(11) Acetal resins such as polyvinylacetal dimethylaminoacetate.
(12) Acryl resins such as a copolymer containing a methacrylic moiety as the main constituent.

Among these, particular preference is given to methyl cellulose (e.g. Metrose, trademark of Shinetsu Kagaku), ethyl cellulose (e.g. Ethocellu, trademark of Dow Chemical), polyvinylalcohols (e.g. KH-20, KH-27, trademarks of Nihon Gosei Kagaku), cellulose acetate butyrate (e.g. CAB 381, trademark of Eastman Kodak Co.), carboxymethyl cellulose (e.g. Sanrose, trademark of Sanyo Kokusaku Pulp), polyvinyl butyryl (e.g. BM-2, trademark of Sekisui Kagaku) and the like, because of giving a smooth, non-tacky surface on said slip layer.

The above said high molecular weight substance and dyestuff may be admixed in an appropriate proportion depending on the use. Usually, to 100 parts by weight of the high molecular weight substance, 0.01 to 20 parts by weight, more preferably 0.1 to 10 parts by weight, of the dyestuff are employed. When the amount of the dyestuff is less than the said lower limit, the coloring becomes weak, resulting in the decrease in contrast between an exposed area and an unexposed area. When the amount is larger than the said upper limit, a long time exposure is required for obtaining a better quality image at the high-light area and in case of a photobleaching dyestuff, for the required photo-bleaching reaction to reduce the practical value.

In addition to said essential components, there may be incorporated in the slip layer any additive such as a plasticizer, a dispersing agent, a sensitizing agent or the like for various purposes, such as improvement in compatibility between the dyestuff and the higher molecular weight substance, acceleration of photo-bleaching reaction, and improvement in various physico-chemical properties of the formed coating. In preparing a slip layer on a photosensitive layer, the aforesaid various components are dissolved in an appropriate solvent and thus obtained solution is directly applied on a photosensitive layer.

Alternatively, the said solution is coated on a silicon releasing layer provided on a sheet or film form of protective layer or directly on a protective sheet or film, to make the desired slip layer, and thus formed laminate is bonded onto a photosensitive resin layer provided on a support by a conventional means.

As the solvent, any of the medium capable of dissolving the high molecular substance, dyestuff and other additives may be satisfactorily used, including water, alcohols (e.g. methanol, ethanol, propanol); ketones (e.g. acetone, methyl ethyl ketone), aromatic hydrocarbons (e.g. benzene, toluene, xylene) and combination thereof.

The solid content of said solution is usually from 1 to 60% by weight, preferably from 5 to 40% by weight. This is because if the solid concentration is less than 1%, the solution viscosity will become too low and it is difficult to obtain a coating with the desired thickness and if the solid concentration exceeds over the upper limit of 60% by weight, it is quite difficult to obtain the desired clear solution.

The application of thus obtained solution may be effected by any conventional means, such as dipping, brushing, spraying, roll-coating, curtain coating, bar coater coating and the like. After applying the solution, it is air-dried, vacuum dried, hot-air dried or the like to obtain a colored slip layer. The dry film thickness of said layer is usually from 0.5 to 20 $\mu$m and preferably from 0.5 to 5 $\mu$m. If the slip layer thickness is less than 0.5$\mu$, the dyestuff concentration is too low to have the desired effects of the invention and if it exceeds the upper limit of 20$\mu$, there is a tendency that the photosensitivity of the underlying resin layer will be lowered and turbidity will appear at the exposed area.

The protective film or sheet may be made of any plastic materials (e.g. polyester, polycarbonate, polyacrylate, polypropylene and the like), whose surface may be preferably roughened by chemical etching or physical polishing (e.g. sandblast) to a surface roughness of 5 $\mu$m or less.

The thickness of the protective film or sheet may be varied in a considerable range, but it is preferred to be from about 10 to 300$\mu$.

In order to assure the separation of the protective film or sheet from the slip layer, a releasing layer should preferably be provided therebetween. Such releasing layer may be provided by treating said roughened surface of the protective film with a silicone resin so as to give a dry-thickness of abut 0.1 to 0.5$\mu$. If the releasing layer is not provided, the complete and easy separation of the protective film or sheet from the slip layer is rather difficult to do even if the photosensitive resin layer has a great tackiness. Therefore, employment of such releasing layer, though it is not essential in the present invention, is highly recommended. In this case, the aforesaid slip layer may be advantageously formed on the releasing layer and thus formed laminate is bonded to a photosensitive resin layer.

As the silicone resin, there are known two types of resins, i.e. (A) the addition curing type resin having the formula:

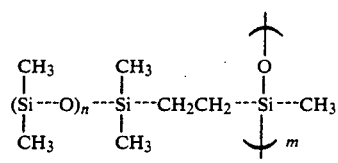

and (B) the condensation curing type resin having the formula:

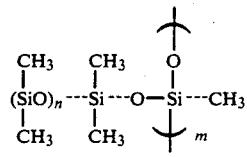

Examples of the commercially available silicone resins are Toray silicone paper coating agents of addition type "SD 7226" (catalyst "SRX 212" and of condensation type "SRX 244" (catalyst "SRX 242 AC").

The invention can never be limited to any specific method used for the production of said laminated, printing material. However, the photosensitive resin layer provided on a support and the colored slip layer provide, with or without intervention of a releasing layer, on a protective film or sheet are preferably brought into close contact and bonded by a conventional combining means as heat pressing, laminating or extrusion molding.

On the use of thus formed printing material, the protective film or sheet is eliminated, with or without the releasing layer, so that the colored slip layer remains on the surface of the photosensitive resin layer. Then, an original is placed on said slip layer and the combined sandwich is exposed to light for a desired period of time. Treatment of the exposed material with a developer, preferably while brushing, accomplishes development and affords a printing plate having an excellent relief exactly copying the image in the original.

For development of such photosensitive resin base printing material, there may be used any solvent system comprising, for example, as the major solvent water, an alkaline aqueous solution, an alcohol, a chlorinated hydrocarbon (e.g. perchlorethylene, trichlorethylene, 1,1,1-trichlorethane, carbon tetrachloride), an aromatic hydrocarbon (e.g. toluene, xylene), a ketone (e.g. methyl ethyl ketone, methyl isobutyl ketone), a cellosolve acetate or any combination of the same. However, an optimum solvent system may advantageously be selected depending on the high molecular weight binder used in the photosensitive resin layer.

Since the photosensitive resin base printing material of the invention has the colored slip layer on the surface of the photosensitive resin layer, the tackiness of the photosensitive resin layer does not cause any problems.

Further, the favorable lubricity of the slip layer makes easy the operation to bring an original into close contact with the surface of the photosensitive resin layer.

Besides, the slip layer is readily eliminated on treatment with water, alcohol, organic solvent or combination thereof for development and therefore does not afford any unfavorable influence on the printing characteristics of the printing plate obtained from the present printing material. Furthermore, a dyestuff is included in an effective amount in said slip layer and therefore, it will absorb a quantity of incident light and reflected light from a support at an upper portion of the photosensitive resin layer, but can never give any undesired effect on the penetrating light at the lower portion of the photosensitive resin layer. Therefore, an optimum condition for the exposure of both upper and lower portions of the resin layer can be established therewith, and better quality images can be obtained in both highlight and shadow areas. Resolution of a printing material is thus improved in great extent. Even if a dyestuff in the slip layer should migrate into a photosensitive resin layer, it always remains at a considerable concentration at an upper portion of the resin layer, and therefore, the aforesaid beneficial effects can be likewise obtained.

The invention shall be now more fully explained in the following Examples. Unless otherwise being stated, all parts and percentages are by weight.

EXAMPLE 1

In this example, a photosensitive resin sheet consisting of 66.00 wt % sindiotactic 1,2-polybutadiene, 27.19 wt % tetrahydro-dioctylphthalate, 5.35 wt % neopentylglycoldimethacrylate, 0.70 wt % benzyl-dimethylketal, 0.52 wt % 2,6-di-t-butyl-p-cresol and 0.04 wt % hydroquinone monomethylether was used.

Onto one surface of said photosensitive resin sheet of 5 mm thickness, a polyester sheet was provided as a supporting material.

Separately, on a protective polyester film whose surfaces have previously been chemically etched (100 μm in thickness and 3.0 μm in average roughness), Toray silicone SRX 244 (solvent type silicone resin, trademark of Toyo Rayon, with SRX 242 AC catalyst) was applied by a doctor blade so as to give a releasing layer of 0.5 μm in thickness. After being allowed to stand at a room temperature for 24 hours, a 5% by weight solution of a mixture of 100 parts of ethyl cellulose (45% ethoxy content, medium type, Dow Chem.) and 0.2 part of Sumiplast blue-G (Trademark of Sumitomo Chem. Co., C.I. Solvent blue 11, color index 61525) in an isopropyl alcohol/toluene mixed solvent was applied onto the releasing layer by means of a bar coater to make a colored slip layer of 3 μm thickness and dried.

Then, the aforesaid photosensitive resin sheet backed with the supporting material was heated in a hot wind drying furnace at 60° C. for 2 minutes, and the colored slip layer formed on the protective polyester film with intervention of the releasing layer was brought into contact with the heated photosensitive resin sheet to combine them together. Thus prepared laminate was placed on a cooling plate having a surface temperature of 16° C. for 10 minutes to give a photosensitive resin base printing material, in which a colored slip layer was provided on one surface of the photosensitive resin layer and said slip layer was protected by a protective polyester film.

Removing the protective polyester film from thus obtained laminated product, there was obtained a photosensitive material having a photosensitive resin layer whose surface was covered by a non-tacky, dyestuff-containing ethyl cellulose film layer (3 μm thickness and 2.4 μm maximum surface roughness) (the so-called slip layer).

An original was placed on said slip layer of the photosensitive material. This placement was easily done and the original was retained at a good contact state.

Then, an ultraviolet ray lamp was irradiated onto the photosensitive resin layer through the original and the colored slip layer for 10 minutes, and the original was taken off. This taken off was easily done without damaging the original as well as the photosensitive material. The exposed area of said material was clear by a photo-bleaching of the dyestuff contained and the unexposed area was blue color. Thus, the original image pattern was visually observed by naked eyes in full.

The thus exposed material was then washed with a mixture of isopropanol and 1,1,1-trichlorethane (1:3 by volume) under brushing for development and dried in a drying furnace at 50° C. for 20 minutes to give a printing plate having a relief exactly copying the image in the original. The exposed area was blue and the shoulder shape of the relief was excellent.

EXAMPLE 2

Onto one surface of the photosensitive resin sheet of 3 mm thickness having the same composition with that of Example 1, a polyester sheet was provided as a supporting material. Separately, on a protective polyester film whose surfaces were not chemically etched (100 μm in thickness), Toray silicone SRX 244 was applied by a doctor blade so as to give a releasing layer of 0.5 μm in thickness. After being allowed to stand at a room temperature for 24 hours, a 5% by weight solution of a mixture of 100 parts of polyvinyl butyryl resin (tripolymer of vinyl butyryl, vinyl acetate and vinyl alcohol, butyrallization 65±2 mole %, number average molecular weight 1000 to 2000) and 0.3 part of Sumiplast blue G in isopropyl alcohol was applied onto the releasing layer by a bar coater to give a colored slip layer of 3 μm thickness and dried.

Then, the above said two were laminated together as in Example 1 to obtain a photosensitive resin base printing material (A).

From the printing material (A), the polyester sheet used as a supporting material was peeled out and the exposed surface of the photosensitive resin layer was contact-bonded to a rubber base plate (Kureha A, trademark of Kureha Kagaku, 2.8 mm thickness) wetted with 1,1,1-trichloroethane. Thus obtained laminate was allowed to stand for 1 hour to prepare a photosensitive resin base printing material (B) having a photosensitive resin layer whose one surface was coated by a non-tacky, blue colored polyvinyl butyryl resin slip layer and the other surface was backed by a rubber base plate of 2.8 mm in thickness.

They were then, after peeling off the respective protective polyester film, exposed to ultraviolet rays through original and developed as in Example 1. However, in this Example, 1,1,1-trichloroethane was used as a developer and the dryinq operation was conducted in a drying furnace at 45° C. for 20 minutes.

Blue-colored, relief image exactly copying the image in the original and having excellent shoulder shape was obtained in either case.

EXAMPLE 3

From the photosensitive resin base printing material (A) obtained in Example 2, the polyester sheet used as a supporting material was peeled off.

Separately, onto a closed cell type urethane foam bonded to a polyester film (3 mm thickness, 0.32 density, 115% elongation, 38% impact resilience, 4.6% compression set), was applied chloroprene rubber adhesives and dried to make an adhesive layer of 20 to 30 μm thickness.

The exposed surface of the photosensitive resin layer was contact-bonded with said adhesive layer to obtain a photosensitive resin base printing material (C).

Thus obtained material (C) was treated in the same way as in Example 2 and an excellent printing plate having blue colored relief image and excellent shoulder shape was obtained.

This plate was set in a flexographic printing machine and used for printing of card boards.

The print was excellent, having no marginal zone and having good image in shadow area as well as in high light area.

EXAMPLE 4

The same procedures as stated in Example 3 were repeated excepting substituting a closed cell type chloroprene foam bonded to a polyester film (4 mm thickness, 0.19 density, 168% elongation, 32% impact resilience, 25.5% compression set) for the urethane foam bonded to polyester film. Very similar results as given in Example 3 were obtained.

EXAMPLE 5

A photosensitive resin sheet consisting of 66.00 wt % syndiothactic 1,2-polybutadiene, 27.19 wt. % tetrahydrodioctylphthalate, 5.35 wt. % neopentylglycol-dimethacrylate, 0.70 wt. % 2,2,-dimethoxy-2-phenylacetophenone, 0.52 wt. % 2,6-di-t-butyl-p-cresol and 0.04 wt. % hydroquinone monomethylether was used.

Onto one surface of the photosensitive resin sheet having a thickness of 3 mm, a polyester sheet was provided as a supporting material.

Separately, on a protective polyester film whose surfaces have previously been chemically etched (100 μm in thickness and 3.0 μm in average roughness), Toray silicone SRX 244 (solvent type silicone resin, trademark of Toyo Rayon with SRX 242 AC catalyst) was applied by a doctor blade so as to give a releasing lever of 0.5 μm in thickness. After being allowed to stand at room temperature for 24 hours, a 5% by weight solution of 100 parts of ethyl cellulose (45% ethoxy content, medium type, Dow Chemical) and 0.2 part of Sumipalst blue-G (Trademark of Sumitomo Chemical Company, C.I. Solvent Blue 11, color index 61525) in an isopropyl alcohol/toluene mix solvent was applied onto the releasing layer by means of a bar coater to make a colored slip layer of 3 μm thickness and dried.

Then, the photosensitive resin sheet backed with the supporting material was heated in a hot wind drying furnace at 60° C. or two minutes, and the colored slip layer formed on the protective polyester film with intervention of the releasing layer was brought into contact with the heated photosensitive resin sheet to combine them together. Thus, prepared laminate was placed on a cooling plate having surface temperature of 16° C. for ten minutes to give a photosensitive material, in which a colored slip layer was provided on one surface of the photosensitive resin layer and said slip layer was protected by a protective polyester film.

EXAMPLE 6

The same procedures as stated in Example 5 were repeated except that 2-(4-diethylaminophenyl)-N-phenylnitrone disclosed in U.S. Pat. No. 4,677,049 was substituted for Sumiplast blue-G to obtain a comparative photosensitive material.

EXAMPLE 7

Using the photosensitive materials of Examples 5 and 6 (i.e. laminated products), printing plates were prepared as follows:

Removing the protective polyester film from the laminated products, there was obtained a photosensitive material having a photosensitive resin layer whose surface was covered by a non-tacky dyestuff-containing ethyl cellulose film layer (3 μm thickness and 2.4 μm maximum surface roughness) (the so-called slip layer).

An original was then placed on said slip layer of the photosensitive material. A chemical lamp (3 mW/cm$^2$, 10 cm distance) was then irradiated onto the photosensitive resin layer through the original and the colored slip layer for 8, 12, or 16 minutes, and the original was taken off.

The thus exposed material was then washed with a mixture of isopropanol and 1,1,1-trichloroethane (1:3 by volume) under brushing for three minutes and dried in a drying furnace at 50° C. for 20 minutes to give a printing plate having a relief exactly copying the image in the original.

Shoulder portions of the thus obtained release dots (0.25, 0.50, 0.75, and 1.00 mm) were observed. The shoulders produced using the photosensitive materials of the present invention (Example 5) appeared to be sharper.

EXAMPLE 8

Onto a silicon oxide wafer base plate was applied a photoresist (Shipley S1400-2S) using a spinner (5000 rpm) and dried in an oven maintained at 85° C. for seven minutes to obtain a resist film of 1.6 μm thickness.

Onto this resist film, a CEL solution comprising 8 g α-(4-diethylamino)phenyl-N-phenylnitrone, 8 g of allyl alcohol styrene copolymer (RJ 101, Monsanto) and 85 g of ethylbenzene was applied using a spinner (5,000 rpm) and dried.

The film thickness of CEL film was 0.3 μm. An original was placed on thus obtained photosensitive material as in Example 1 of the present specification. Then, an ultraviolet lamp was irradiated through the original for ten minutes and the original was then moved. At that time, photo-bleaching was observed.

The exposed material was washed with a mixture of isopropanol and 1,1,1-trichloroethane(1:3 by volume) by brushing for 20 minutes. Thus, developed material revealed that the CEL layer and resist layer were totally removed, including both exposed and unexposed areas. There only remained the silicon wafer having no relief area.

What is claimed:

1. A photosensitive element for use in making a relief printing plate in the form of a laminate, comprising, in successive order:
   a support;
   a photosensitive resin layer having a thickness greater than about 500 $\mu$m, which comprises:
      a binder resin;
      at least one ethylenically unsaturated compound; and
      a photopolymerization initiator;
   a slip layer which consists essentially of:
      a blue anthraquinone dyestuff which is photo-bleached by actinic radiation in the visible to ultraviolet region; and
      a high molecular weight substance selected from the group consisting of ethyl cellulose, hydroxypropyl cellulose, and a partially saponified, at least 50% saponified, polyvinyl acetate, the high molecular weight substance having a weight ratio to said dyestuff of from 100:0.01 to 100:20 and a thickness of from about 0.5 to about 20 $\mu$m; and
   a sheet or film form of protective layer.

2. The photosensitive element of claim 1, wherein the photosensitive resin layer has a thickness between about 500 $\mu$m and about 7.5 mm.

3. The photosensitive element of claim 1, wherein the photosensitive resin layer has a thickness greater than about 3 mm.

4. The photosensitive element of claim 1, wherein the high molecular weight substance of the slip layer is soluble or swellable in water, alcohol, organic solvent or combination thereof.

5. The photosensitive element of claim 1, wherein the support is a metal plate, a plastic plate, a natural or synthetic rubber plate, or a laminate of either combination of the same.

6. The photosensitive element of claim 1, wherein the photosensitive resin layer consists essentially of a high molecular weight binder, a polymerizable unsaturated monomer or monomers and a photo-initiator.

7. The photosensitive element of claim 1, wherein the protective layer is a plastic sheet or film having a surface roughness of 5 $\mu$m or less.

8. The photosensitive element of claim 7, wherein the protective layer has a surface roughness of 5 $\mu$m or less.

9. The photosensitive element of claim 8, wherein said releasing layer has a thickness of 0.1 to 0.5 $\mu$m and said slip layer has a thickness of 0.5 to 20 $\mu$.

10. The photosensitive element of claim 1, wherein a releasing layer is located between the slip layer and the protective layer.

11. The photosensitive element of claim 10, wherein the releasing layer is a silicone type releasing layer having a thickness of from 0.1 to 0.5 $\mu$m.

* * * * *